DIP-SOLDERED MODULE AND METHOD OF MAKING THE SAME
Filed Dec. 23, 1963
FIG. 1
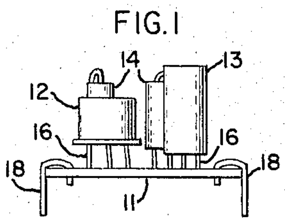
FIG. 2
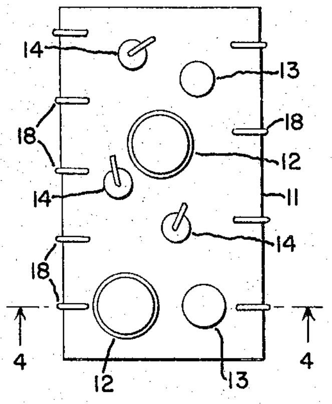
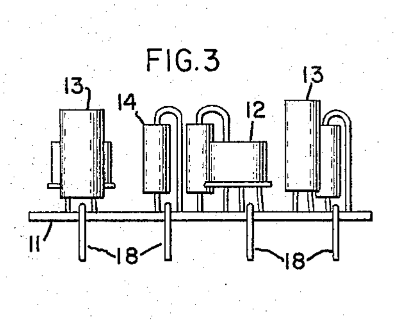
FIG. 4
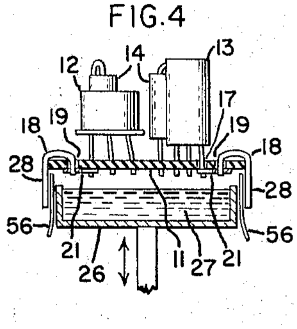
FIG. 5
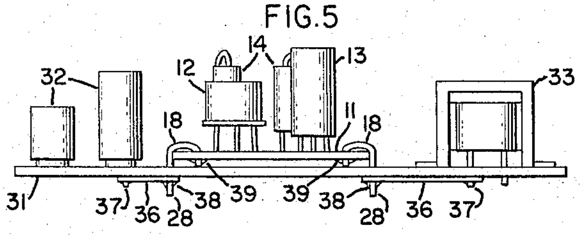
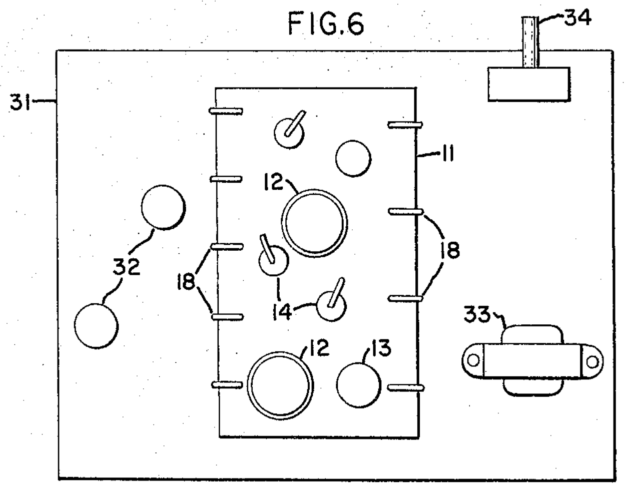
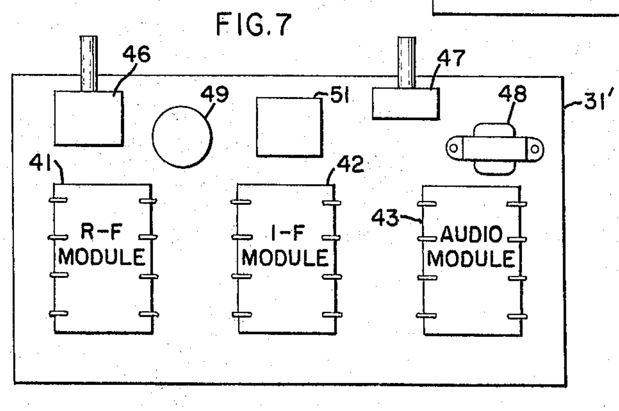
INVENTOR:
JAMES A. WIESE,
BY Norman C. Fulmer
HIS ATTORNEY.

United States Patent Office 3,283,060
Patented Nov. 1, 1966

3,283,060

DIP-SOLDERED MODULE AND METHOD OF MAKING THE SAME

James A. Wiese, Whitesboro, N.Y., assignor to General Electric Company, a corporation of New York Filed Dec. 23, 1963, Ser. No. 333,796
7 Claims. (Cl. 174—68.5)

This invention relates to electrical circuits, and more particularly to an improved construction and method for modular assemblies of printed circuit boards.

In radios, television receivers, and other electronic equipment, it sometimes is desirable to employ modules which contain a portion of the total circuit, these modules being connected to each other or to a master circuit board to form an assembly constituting a complete circuit. The modules usually comprise printed circuits and are provided with connector wires or terminals for electrical and mechanical attachment to the other modules or to the master circuit board.

An object of the invention is to provide an improved modular circuit construction and method.

Another object is to provide an improved modular circuit construction and method in which dip-soldering or other suitable technique is used for attaching components to the circuit boards of the circuit assembly.

Other objects will be apparent from the following description and claims, and from the accompanying drawing.

The modular circuit construction of the invention comprises, basically and in its preferred embodiment, a module circuit board having terminal openings therethrough where connections are desired to be made to another circuit board, terminal connector leads having substantially mutually parallel leg portions extending in the same direction and respectively each arranged so that the first leg portion thereof extends downwardly through and is connected to a terminal opening of the module circuit board and the second leg portion thereof extends downwardly at or beyond the edge of the module circuit board or beyond the edge of areas to be soldered on the module circuit board. These second leg portions respectively extend into and are connected to terminal openings of a second circuit board.

A preferred method of the invention comprises the steps of providing a circuit board having terminal openings therethrough providing connector leads having substantially mutually parallel leg portions, placing the connector leads with first leg portions thereof respectively extending downwardly through the terminal openings and with the second leg portions thereof extending downwardly at or beyond the edge of the circuit board or beyond the area of the circuit board to be soldered, soldering from the underside of the board the first leg portions of the connector leads to printed circuits on the board at the terminal openings, placing the modular board with respect to a second circuit board so that the second leg portions of the connector leads extend through terminal openings of the second circuit board, and soldering from the underside of the second circuit board the second leg portions of the connector leads to printed circuits at the terminal openings of the second circuit board.

FIGURE 1 of the drawing is a front view of a circuit module in accordance with a preferred embodiment of the invention;

FIGURE 2 is a top view of the circuit module;

FIGURE 3 is a side view of the circuit module;

FIGURE 4 is a cross-sectional view taken on the line 4—4 of FIGURE 2, and furthermore illustrates the step of dip-soldering the circuit module;

FIGURE 5 is a front view of a complete modular circuit assembly in which the circuit module of FIGURES 1 through 4 is attached to a master circuit board;

FIGURE 6 is a top view of the assembly of FIGURE 5; and

FIGURE 7 is a top view of a radio circuit assembly having a plurality of circuit modules for performing different circuit functions.

Now referring particularly to FIGURES 1 through 4 of the drawing, a preferred embodiment of the circuit module comprises a printed circuit board 11, having printed electrical circuits applied thereon in well-known manner, and having one or more electrical circuit components attached thereto. For example, there are shown in the drawing components in the form of transistors 12, capacitors 13, and resistors 14. Lead wires 16 of these components extend into or through suitable terminal openings 17 of the printed circuit board to make connection to printed circuits in well-known manner.

One or more terminal connector leads 18, each preferably in the form of an open loop having substantially parallel leg portions, are positioned on the circuit board 11 with one leg portion thereof extending down through an opening 19 through the board 11 near an edge thereof, as shown, the remaining leg portion of the connector 18 extending downwardly beyond the edge of the board 11, or at least beyond the portion of the circuit board that is to be dip-soldered as will subsequently be described. The connectors 18 are preferably made from wire, which may have any desired cross-section shape such as circular, and may be generally shaped in the form of an inverted J as shown in the drawing, or may alternatively be U-shaped or may have other suitable shapes to meet the purposes of the invention. As shown in FIGURE 4, printed circuits or printed wiring elements 21 carried by the board 11 interconnect the terminal openings 19 with openings 17 for the component lead wires 16, in the manner to provide a desired electrical circuit.

The circuit module preferably is assembled by a method comprising the steps of mounting the various circuit components 12, 13, 14 with their lead wires 16 extending through the proper openings 17 of the circuit board 11, and mounting the connector wires 18 each with a leg thereof extending through a suitable opening 19 of the circuit board 11. This mounting of components and terminal wires onto the circuit board may be accomplished either by hand or by automatic machinery. The component lead wires 16 and the terminal wires 18 are now all soldered to the printed conductors 21 of the circuit board 11, all simultaneously, by bringing a dip-soldering tray 26 of molten solder 27 up to the underside of the circuit board 11, whereupon all of the component leads 16 and all of the terminal connectors 18 become soldered and remain soldered to the circuit module upon lowering of the dip-soldering tray 26 away from the circuit board 11. Conversely, of course, the circuit board 11 could be temporarily lowered to a fixedly positioned soldering tray 26. Hold-down means may be employed to hold the components 12–14, and connectors 18, in place during the soldering process. Alternatively, instead of employing a tray of molten solder as shown in FIGURE 4, molten solder may be sprayed toward the underside of the circuit board 11 in order to achieve the soldering of connections.

During the soldering process, and in accordance with the invention, the soldering of the entire area of the circuit board that is to be soldered at various points, is readily achieved, without any solder being applied to the leg portions 28 of the connectors 18 which extend downwardly outside of and beyond the soldering area. Thus, this desirable feature of the invention leaves the as yet unconnected legs 28 clean and free from extraneous solder so that they may be readily inserted into openings of a master circuit board as will be subsequently described. If, in the soldering of the circuit module, solder were allowed to reach the connector legs 28, it would tend to make these legs too thick, especially when droplets of molten solder might form and solidify on these legs, whereby they might not properly fit into openings of the master circuit board at a later step of the invention.

After the circuit module of FIGURES 1 through 4 has been assembled and soldered as described above, it is mounted onto and soldered to a master circuit board 31 which may contain other electrical components such as capacitors 32, transformer 33, potentiometer 34, and other components if desired. The circuit board 31 is called a master circuit board for convenience, as it may contain a plurality of circuit modules as shown in FIGURE 7, and generally is larger than a single circuit module; however, the so-called master circuit board may if desired comprise another circuit module either entirely or partly underneath, or at the side of, the circuit module described above.

As most clearly shown in FIGURE 5, the circuit module is mounted to the master circuit board 31 with the legs 28 of the connectors 18 extending through suitable openings in the master circuit board 31. Preferably, the bottom of the board 11, or wires or solder at the underside thereof, rest against the top of the master board 31, as shown to facilitate positioning and so the legs 28 will provide rigid attachment of the units. Printed conductors 36 on the master circuit board 31 interconnect the openings for the connector legs 28 with suitable openings for the connector leads 37 of the components 32, 33 etc. carried by the master circuit board 31, in a pattern to form a desired electrical circuit as is well-known in the art. The master circuit board 31 is then soldered from the underside thereof, either by the use of a tray of molten solder as shown in FIGURE 4, or by the previously described solder-spray technique. In FIGURE 5, soldered connections 38 at the master board 31, and soldered connections 39 at the module board 11, are shown. The circuit module is attached to the circuit board 31, both electrically and mechanically, by means of the connectors 18. In accordance with the invention, the dip-soldering or spray-soldering or other suitable technique is used for attachment of terminals and component lead wires to both the module circuit board 11 and to the master circuit board 31, and this is achieved without distorting the shapes of the connector legs 28 nor by having any undesired solder applied thereto, prior to the time when these connector legs 28 are soldered to the master circuit board 31. When the component leads and connector leads are soldered to the master circuit board 31, the previously soldered connections on the module circuit board 11 are not disturbed, because of its isolated and shielded position above the master circuit board.

Terminology herein as to the connector legs extending "downwardly," and as to the soldering being done at the "underside" of the circuit boards, is used for convenience and is intended in a relative sense to connote that the connector legs extend in the same direction and that the soldering is performed on the opposite sides of the circuit boards from which the connector legs are inserted.

In FIGURE 7, a master circuit board 31 has attached thereto a plurality of circuit modules, for example a radio frequency circuit module 41, an intermediate frequency circuit module 42 and an audio frequency amplifier module 43. To form a complete radio circuit (except for loudspeaker), the master circuit board may contain attached thereto a tuning capacitor 46, a volume control 47, and other components if desired such as an audio transformer 48, capacitor 49, and a solid-state rectifier device 51. One advantage of such a modularized total circuit, is that a variety of types of the different modules may be made available, for example a low-cost type of each of the three modules shown, and a higher cost and higher quality type of each of the three modules. Thus, a low-cost radio may be made, using the master circuit board 31, by positioning thereon and soldering thereto the three lower cost versions of the modules 41, 42 and 43. Also, a higher performance radio can just as readily be made, utilizing the same master circuit board 31, by attaching thereto the higher quality circuit modules 41, 42 and 43. These higher quality versions of the modules may comprise, for example, in the case of the radio frequency module 41, a tuned radio-frequency state whereas the low-cost version could comprise a converter circuit without any radio-frequency amplification. The higher quality IF module 42 could comprise three or four stages of intermediate frequency amplification, whereas the economy versions could employ one or two stages of IF amplification. The higher quality audio module 43 could comprise push-pull audio output, whereas the economy version could comprise a single stage output circuit.

Various modifications or other features may be employed with the invention. For example, the module circuit board 11 could be punched out from the master circuit board 31 at the place where the circuit module is to be positioned, thereupon conserving circuit board material, provided that such an opening in the master circuit board would be feasible as regards the strength of the master circuit board and if no printed circuitry is located on the master circuit board in the area punched out to provide the module circuit board. If desired, two or more circuit modules could be stacked up vertically, with the higher one being slightly larger than the lower one so that the connector legs 28 of the higher one will extend down to the master circuit board 31 beyond the edge of the lower module board. Alternatively, one or more connector legs 28 of the upper circuit module could extend down to the master circuit board 31 through openings in the lower module board. Also, a combination of the foregoing could be employed. Although the modular circuit board 11 is shown as preferably mounted close to and parallel to the master circuit board 31, it may if desired be substantially spaced from the master circuit board 31 whereupon it would clear any components such as capacitor 32 or transformer 33, or another circuit module, carried by the master circuit board 31 at a position over which the circuit module is located. Also, the connector legs 28 at one side of the circuit module may be longer than at the other side thereof, whereby the module circuit board 11 will be tilted with respect to the master circuit board 31, if desired, in order to save space or to interfit in a more desirable manner with components carried by the master circuit board 31.

Preferably, the connectors 18 are located along two opposite edges of the module circuit board 11, in order to facilitate the assembly thereof, and the dip-soldering thereof, on a moving assembly conveyer system. Also, the location of the connectors 18 along two opposite edges of the circuit board 11, permit the use of elongated strip-like solder shields 56 at a suitable location along the moving conveyer system so as to absolutely prevent any solder from the molten solder tray 26, or from the alternative spray-soldering arrangement, from accidentally reaching the connector legs 28.

Either or both legs of the connectors 18 could, if desired, be bent against the underside of the respective circuit boards after their insertion therethrough, but this is not necessary, in accordance with the invention, the important requirement being that the connectors have two leg portions that are sufficiently mutually parallel, or which extend in generally the same direction, so as to be inserted into openings of respective circuit boards from the "top" sides of the circuit boards and soldered or otherwise attached at the "bottom" sides of the circuit boards. The connector leg to be inserted into the module board 11 could be curved or bent, prior to insertion in the board 11, so long as at least a portion thereof, or the general configuration thereof, is sufficiently parallel to the other leg to permit assembly in accordance with the invention.

The connector 18 preferably are arranged so that the outer legs 28 thereof are adjacent to or against an edge of the module board 11, as shown, to aid in proper positioning of these outer legs 28 for insertion into openings of the second circuit board 31. Notches or openings could be provided at the edges of the module board 11, if desired, to increase the accuracy of positioning of the legs 28. Also, slots or jigs in the conveyor system for production of the modules may be provided to accurately position the outer legs 28 when the module is soldered.

While preferred embodiments and modifications of the invention have been shown and described, various other embodiments and modifications thereof will be apparent to those skilled in the art, and will fall within the scope of invention as defined in the following claims.

What I claim is:

1. A circuit module comprising a circuit board provided with at least one terminal opening therethrough and having an area including said terminal opening in which component leads are attached to the circuit board, and a connector lead having two legs extending generally in the same direction and positioned with a first leg thereof extending into said terminal opening in a direction from the first to the second side of said circuit board and attached to the circuit board, and with the second leg thereof extending in a direction from the first to the second side of the circuit board at a location outside of said area in which the component leads are attached to the circuit board.

2. A circuit module as claimed in claim 1, in which said connector lead is generally J-shaped, said first leg being the shorter leg thereof.

3. A circuit module as claimed in claim 1, in which said terminal opening is near the edge of said circuit board, and in which said second leg of the connector lead is closely adjacent to said edge and extends beyond said second side of the circuit board.

4. A circuit module comprising a circuit board provided with a plurality of terminal openings therethrough near the edge thereof and having an area on the underside thereof including said terminal openings at which component leads are soldered to circuits of the circuit board, and a plurality of connector leads each having two legs extending generally in the same direction and respectively positioned at said terminal openings with one leg thereof extending down through a terminal opening and soldered to a circuit of the circuit board at the underside thereof, and with the other leg thereof extending downwardly at a location outside of said area in which the component leads are soldered to the circuit board.

5. A method of making a circuit module, comprising the steps of providing a circuit board having at least one terminal opening therethrough and having an area including said terminal opening in which leads are to be soldered to the circuit board at the underside thereof, providing a connector lead having two legs extending generally in the same direction, positioning said connector lead so that a first one of said legs extends down through said opening from the upper side of said circuit board and the second of said legs extends downwardly at a location outside of said area to be soldered, and causing the underside of said circuit board to contact a pool of molten solder with said second leg positioned outside said pool so that said first leg of the connector lead becomes soldered to said circuit board while said second leg remains unsoldered.

6. A method as claimed in claim 5, including the step of placing solder shielding means between the area to be soldered and said second leg of the connector leg during the step of applying solder to said area.

7. A method of making a modular circuit assembly, comprising the steps of providing a first circuit board having a plurality of terminal openings therethrough near the edge thereof and having an area on the underside thereof including said terminal openings at which component leads are to be soldered to circuits of the first circuit board, providing a plurality of connector leads each having two legs extending generally in the same direction, respectively positioning said connector leads so that the first legs thereof extend down through respective terminal openings from the upper side of the circuit board and the second legs of the connector leads extend downwardly below said circuit board at locations outside of said area at which the component leads are to be soldered, causing the underside of said circuit board to contact a pool of molten solder with said second legs positioned outside said pool so that said first legs of the connector leads become soldered to circuits of said circuit board while said second legs remain unsoldered, providing a second circuit board having a plurality of terminal openings respectively adapted to receive said second legs of the connector leads, positioning said first circuit board assembly over said second circuit board so that said second legs of the connector leads respectively extend down through said terminal openings of the second circuit board, and applying solder at the underside of said second circuit board whereby said second legs of the connector leads become soldered to circuits of said second circuit board.

References Cited by the Examiner

UNITED STATES PATENTS

| | | | |
|---|---|---|---|
| 2,821,669 | 1/1958 | Christian | 317—101 |
| 2,978,612 | 4/1961 | Lutton | 317—101 |

LEWIS H. MYERS, *Primary Examiner.*

DARRELL L. CLAY, *Examiner.*